SOLAR SIMULATOR

Filed June 4, 1963

INVENTOR.
GEORGE GEIER
BY Peter F. Willig
ATTORNEY 3,325,238
Patented June 13, 1967

3,325,238

SOLAR SIMULATOR

George Geier, Teaneck, N.J., assignor to Keuffel & Esser Company, Hoboken, N.J., a corporation of New Jersey Filed June 4, 1963, Ser. No. 285,496
2 Claims. (Cl. 350—27)

This invention reltates to systems, methods, means, and devices for obtaining parallel radiant energy rays or light rays of uniform illumination intensity and uniform energy distribution over a region or space from radiant energy emitted by a radiant energy source, and refers, more particularly, to obtaining parallel radiant energy rays of uniform illumination intensity and uniform energy distribution and having a complete spectral range and which simulates solar radiation in outer space over a region or space on earth.

Until very recently man had no particular need for simulating solar radiation in the sense of obtaining radiation from a radiant energy source which would give parallel light rays or radiant energy rays of uniform illumination and energy intensity having a complete spectral range and simulating the spectral range of sun light. However, with the recent advances of the various disciplines of science, there has arisen a need for practical means for simulating solar radiation and consequently the need has arise for systems, methods, means, and devices for obtaining from a radiant energy or light source, radiation simulating solar radiation particularly as it occurs in outer space.

In prior art numerous devices and systems have been utilized to achieve substantially parallel light rays, however, these systems and devices did not achieve uniform radiation energy distribution nor uniform illumination distribution and did not give a complete spectral range. These prior art devices were in fact never intended to achieve the simulation of solar radiation.

Although other solar simulators are known, the present invention is believed to constitute a notable achievement in that it simulates solar radiation by means of a system which is not overly complex or costly, and which can utilize a more intense radiation source to give a greater area of simulated radiation per device.

An object of the present invention is to provide a system, method, means, and device for simulating solar radiation particularly at it occurs in outer space.

Another object is to provide a system, method, means, and device for obtaining parallel rays of radiant energy or light rays with a uniform illumination and energy distribution over a region or space and having a complete spectral range.

Another object is to provide means for simulating solar radiation with a system which is not overly complex, and which does not have the disadvantages of prior art.

Still another object is to provide a system which simulates solar radiation over a relatively large region utilizing relatively non-complex devices which may be stacked or clustered so as to have the areas of solar simulation of each individual device contiguous to one another so as to encompass a large region.

A further object is to provide a solar simulator which can use a more intense radiation or light source, and which gives a greater area of simulated radiation per solar simulator unit.

A further object is to provide a solar simulator which provides several (three or more) contiguous collimated radiation bands and which gives a composite area of uniform illumination for a complete spectral range.

A further object is the provision of a system for simulating solar radiation which is relatively easy and inexpensive to manufacture when considering the usual difficulties and expenses in the art, and which can be easily utilized.

Other objects of the present invention will become apparent in the course of the following specification.

The objects of the present invention may be realized by providing a system which comprises a radiant energy source which eminates radiant energy into an outer zone reflector system, an intermediate zone system, and also into an inner zone lens system, and so disposing such system components that said rays (and where desired when joined by rays from an ultraviolet fill-in system) form parallel radiant energy or light rays with uniform illumination intensity and energy distribution over a region or space and which gives a complete spectral range, thereby simulating solar radiation.

The invention will appear more clearly from the following detailed description when taken in connection with the accompanying drawing showing, by way of example, a preferred embodiment of the inventive idea.

Figure 1:
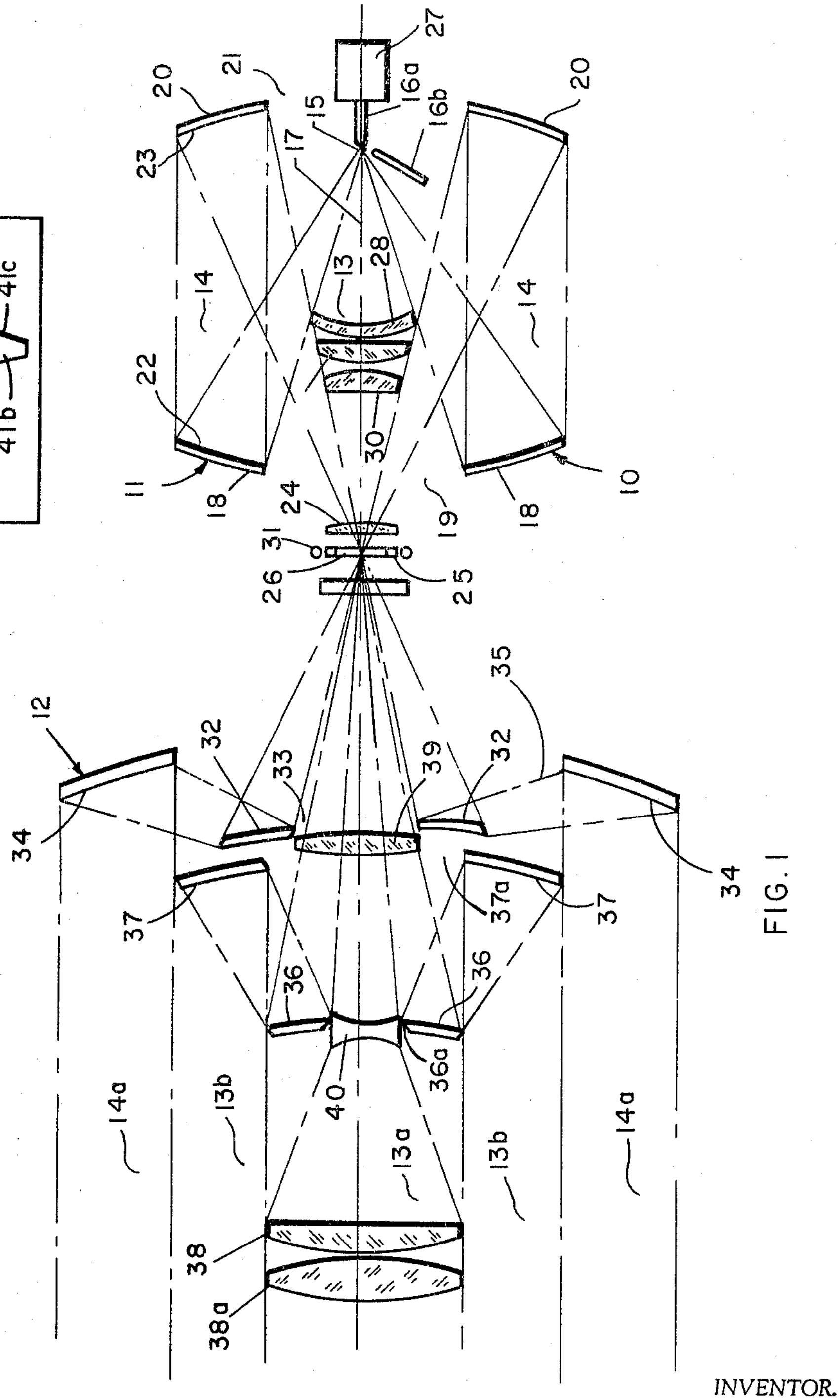
FIGURE 1 is a schematic plan view of the optical system of a solar simulator of the present invention.

The optics of the solar simulator 10 of the present invention is shown in FIGURE 1, and comprises a collector portion 11 and a collimating system portion 12.

The collector portion 11 has an inner zone 13 and an outer zone 14, while the collimating system portion 12 has an inner zone 13*a*, and a Cassegrain portion comprising intermediate zone 13*b*, and outer zone 14*a*.

The outer zone 14 of collector portion 11 comprises a radiant energy source 15 such as a carbon arc from carbon rods 16*a*, 16*b*, the central axis of carbon rod 16*a* lying on the axis 17 of solar simulator 10, an aquadric or aspherical reflector 18 having a centrally disposed aperture 19, and an aquadric or aspherical reflector 20 having a centrally disposed aperture 21. Xenon-mercury arc lamps and similar arc lamps are also suitable as the radiant energy source 15. Very high intensity radiation sources can be used in the present invention such as, for example, extremely high energy carbon arcs and other similar sources such as gaseous fed tungsten arc lamps. The aspherical reflector 18 is disposed in front of radiant energy source 15, and aspherical reflector 20 is disposed behind radiant energy source 15.

The aspherical reflectors 18 and 20 are made of brass, copper, nickel, steel, aluminum or other material of an equivalent satisfactory nature which can be shaped, and have aluminized surfaces 22 and 23, which are evaporated on the reflectors 18 and 20 in order to give high reflectivity.

The optics of the outer zone 14 in the collector portion 11 are essentially reflecting optics such as the reflectors 18 and 20, however, the optics of the outer zone 14 of the collector portion 11 further comprises field lens 24 which is disposed adjacent to diaphragm 25. The diaphragm 25 has an aperture 26 and is essentially at the focal plane of the collector portion 11. The field lens 24 is only slightly displaced from the focal plane of the collector portion 11. For practical purposes, the field lens 24 can be considered to be disposed at the focal plane. The field lens 24 has practically no effect on the location of the image of the collector system.

Feed mechanism 27 for feeding carbon rods 16*a*, 16*b* as required, extends through aperture 21 of aspherical reflector 20. As previously indicated, other types of radiant energy sources may also be used.

It should be noted that aspheric reflectors of conic section curvature (quadric surfaces) give coma but no spherical aberration. Aspherical reflectors having curvatures to formulae containing higher order terms (aquadric surfaces) on the other hand, can be designed to eliminate both coma and spherical aberration.

The field lens 24 tends to concentrate the edge rays which tend to spread out from the desired path.

The inner zone 13 of collector portion 11 comprises a first sapphire lens 28, a second sapphire lens 29, and a quartz lens 30 each of which are disposed on the axis 17 of the solar simulator 10 between the radiant energy source 15 and aperture 19 in aspherical reflector 18. Therefore it may be seen that the inner zone 13 of collector portion 11 has optics which may be classified as refracting optics. Lenses 28, 29, 30 can alternatively be replaced by two aspheric quartz lenses which are designed for the system.

Sapphire and quartz are used because of their broad spectral transmission band. Sapphire is used because it has a higher index of refraction than quartz so it can be made to equivalent power with less curvature and therefore less spherical aberration. An alternative would be to use aspheric refractors all of quartz or other suitable materials.

An ultraviolet fill-in radiation source 31, preferably in the shape of a torus, may be disposed at the focal plane of the reflectors 18 and 20 completely about diaphragm 25. The ultraviolet fill-in radiation source 31 supplies additional ultraviolet radiation in order to reinforce the energy in the UV part of the spectrum. It is however not as well collimated as the main portion of the energy.

The outer zone 14*a* of the collimating system portion 12 comprises the convex surface aspheric or spheric (depending on design conditions) aluminized reflector 32 having a centrally disposed aperture 33, and an aluminized reflector 34 for example of parabolidal or aquadric shape having a centrally disposed aperture 35.

The intermediate zone 13*b* of the collimating system portion 12 comprises an aspheric or spheric aluminized reflector surface or mirror 36 having a centrally disposed aperture 36*a* in the reflector surface, and an aluminized reflector 37 for example of parabolidal or aquadric shape having a centrally disposed aperture 37*a*. The reflectors 32, 34, 36 and 37 can be made of materials similar to those described as suitable for reflector 18.

The inner zone 13*a* of collimator portion 12 comprises two positive quartz lenses 38 and 38*a*.

Where desired a lens 39 may be inserted in the centrally disposed opening of reflectors 32 and 37. If it is desired to minimize the distance between reflectors 36 and 37, the size of the apertures of reflectors 32 and 37 may be made smaller relative to the outer diameter of reflector 36 and a negative lens may be inserted as lens 39, since a negative lens tends to spread the light rays passing through apertures 33 and 37*a* thereby enabling the reflector 36 to be closer to reflector 37 and still completely illuminated. On the other hand, if it should be desired that the diameter of reflector 36 be relatively decreased with respect to the size of apertures 33 and 37*a* or that it be further separated from reflector 37, then a positive lens 39 would be used, since a positive lens would tend to contract the rays passing through the apertures 33 and 37*a* thus allowing for a smaller angular subtense by reflector 36 at the position of lens 39. This is a design consideration and is used to control the size of the apertures 33 and 37*a* in the reflectors, and the size of the diameter of reflector 36, and the distances between.

If desired, a negative lens 40 may be placed in aperture 36*a*. The negative lens 40 tends to spread the rays passing through the aperture 36*a* and therefore enables lenses 38 and 38*a* to be brought closer to reflector 36, and the complete uniform collimation desired is still obtained.

Figure 2:
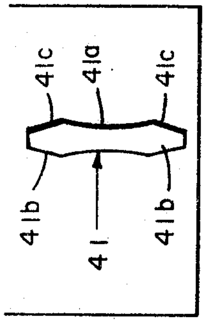
FIGURE 2 shows an optical member for use in the present invention.

A third alternative would be to replace reflector 36 and lens 40 with a quartz lens 41 as shown in FIGURE 2. The lens 41 has a negative lens central portion 41*a* and a positive outer portion 41*b* with an aluminized or otherwise adequately reflective surface 41*c* which performs the function of reflective surface 36, previously described. The lens 41 also takes the place of the negative lens 40 which was previously described as being disposed in aperture 36*a*. The negative lens 41 at the plane of reflector 36 is used for the purpose of enabling lenses 38 and 38*a* to be brought closer to the remainder of the solar simulator 10, thereby shortening both the optical length and the physical length of the solar simulator 10.

It should be further noted that the two lenses 38 and 38*a* might be replaced by one positive quartz lens of proper designs.

The light impinging on reflector 32 is generally from the outer zone 14 of collector portion 11. The light impinging on the reflector surface 36, while mostly coming from the inner zone rays of collector portion 11, can also comprise some additional rays from the outer zone 14 of collector portion 11, and this may be specifically designed into the system.

Further, note that the system may be designed so that some rays from inner zone 13 of collector 11 are also reflected off reflector 32 into the outer zone 14*a* of collimator 12. The considerations which would warrant such a design are the desire for having a completely uniform intensity of radiation and full spectrum band uniformly throughout the entire region of collimated simulated solar radiation.

The lenses 38 and 38*a* collimate the inner zone energy.

The focus of the collimating system portion 12 as well as the other collimating portions is disposed at the focus of the collector system 11.

If only a partial region of solar simulation is desired, the system may be operated with only the outer zone 14*a*.

FIGURE 1 shows the optical system of the solar simulator 10 of the present invention, and the various support structure members which are not shown or described in this application, are described and shown in my co-pending U.S. patent application, Ser. No. 203,021, filed June 18, 1962, now Patent 3,200,253, issued August 10, 1965. The structure and support means described in that application are equally applicable to the present invention with whatever minor modifications would appear necessary. Further, the outer structures of the solar simulator 10 of the present invention may have hexagonal peripheries as described in my prior application for facilitating stacking a number of these solar simulators parallel to one another so as to achieve a modular solar simulator comprising a plurality of units.

The solar simulator 10 of the present application may be utilized in a vacuum chamber as described in my copending application.

The outer band of the inner zone energy impinges upon reflector surface 36 and is reflected to the reflecting surface of reflector 37 from which it is collimated past the edge of lenses 38 and 38*a* and forms a contiguous uniform intensity of illumination with the collimated light passing through lenses 38 and 38*a* and also with the collimated light reflected from reflector 34.

As noted the energy reflected from reflector 32 is made up mostly of energy from the outer zone 14 of collector portion 11, but the system may be designed such that a portion of the inner zone energy from collector portion 11 impinges upon reflector 32. In some cases it may be desired to combine both inner and outer zone energy on reflector 32 to get a more uniform illumination intensity in the final band of collimated light emitted from the entire solar simulator.

The light impinging on reflector 36 is primarily from the inner zone 13 of collector portion 11 but may be designed to also reflect radiant energy coming from the outer zone 14 of collector portion 11. This design alternative again might be useful should it be necessary to attempt to attain an even more uniform illumination intensity across the entire band of collimated light eminating from the solar simulator 10.

As was previously indicated, the lens 39 may or may not be used in the system depending on the desired ratio between the outer diameter of reflector 36 and the apertures 33 and 37*a* and the separation between the elements. Further, it was indicated that lens 39 might be a positive lens or a negative lens, the former aiding in contracting the rays impinging thereupon and this diminishing the necessary diameter of reflector 36, while a negative lens 39 would spread the rays thereby in general necessitating having a reflector 36 of a larger diameter.

In place of the reflector 36 one could use an optical element such as a lens having an inner portion which is a negative lens and convex outer portion which could serve as a reflector 36. The inner portion or the negative lens would enable the positive lenses 38 and 38*a* to be brought closer to the plane of reflector 36 and thereby decrease the length of the solar simulator 10. If ample longitudinal space is available the negative lens 40 or 41*a* may be omitted and the diverging light passing through the aperture may be allowed to strike the lens 38 directly after it has expanded to cover the diameter thereof, the lens 38 being sufficiently separated from the mirror 36.

When the solar simulator 10 operates as described above a uniform intensity of illumination is achieved which comprises three contiguous areas and thereby enables a much more powerful radiation source 15 to be utilized in the invention and which then gives a greater area of solar radiation simulation than has been possible with prior art simulators.

The manner of operation and use of the present invention is as follows:

The radiation from the radiant energy source 15 is used as a source of radiation for the outer zone 14*a*, intermediate zone 13*b*, and inner zone 13*a*.

That portion of the radiation which goes to the outer zone 14 is collected by aspherical reflector 18 which collimates the radiation and reflects it to the second aspherical reflector 20, which forms an image of the radiant energy source 15 at the focal plane of the collector system 11 at which is disposed the diaphragm 25. The image of the radiant energy source 15 is magnified at the focal plane in the aperture 26 of diaphragm 25. The intensity of illumination or energy from the radiation source passing through the diaphragm 25 may be varied by controlling the size of the aperture 26. Thus an enlarged image of the source of radiation 15 is formed directly beyond the field lens 24.

The outer zone radiation is then reflected from the aspherical reflector 32 to the parabodial reflector 34 which collimates the outer zone energy in a region outwardly from adjacent to the edge of the reflector 37. This collimated outer zone energy is part of the final solar simulation energy. The reflectors 32 and 34 make up part of the collimating system 12.

The concept of the outer system of the present invention has the advantage that the curvatures required in the reflectors 18 and 20 are much less severe than one would anticipate finding in such a system. The reflectors 18, 20 therefore lend themselves more readily to correction of coma by reiteration methods, and make it easier to contour the surface and for centering of these elements. Also the design of the fill-in lenses for the inner zone is greatly simplified.

The radiation from the radiant energy source 15 in the inner zone 13 is imaged by the collecting lens system comprising the lenses 28, 29 and 30 and is imaged just beyond the field lens 24 in the focal plane which is also the plane of the diaphragm 25. The central portion of this inner zone energy then passes through the fill-in system comprising positive lenses 38, 38*a* in FIGURE 1, (or in the alternate designs, lens 39, negative lens 40, and positive lenses 38 and 38*a*) which collimate this portion of inner zone energy which is part of the solar simulation energy.

Some of the radiation from radiant energy source 15 in inner zone 13 (and as explained above, some energy from outer zone 14 where desired), impinges upon surface 36 and is reflected to reflector 37 from which it is reflected to form an intermediate zone 13*b* collimated light region contiguous with both the collimated light in outer zone 14*a* and inner zone 13*a*.

Thus the collimated energy in the outer zone 14*a* and inner zone 13*a* are contiguous with the light in the intermediate zone 13*b* and any blank spaces there between is held to a minimum. FIGURE 1 shows a number of energy rays and how they pass through the system, and further how the different rays are located with respect to various optical and mechanical elements in the system.

This collimated energy comprises rays which are parallel to 1° (the angle subtended by the source) and have uniform illumination and energy distribution over the entire area covered within close tolerances, and which have a complete spectral range from .2 to 3.6 mu and simulate solar radiation (the Johnson spectrum).

The oblique rays or edge rays from the radiant energy source 15 can be interpreted in terms of the coma flare. However, it is more helpful to estimate the uniformity of illumination from the oblique rays.

An aplanatic system (corrected for spherical aberration and coma) is achieved by the proper combination surface design of reflectors 18 and 20, and reflectors 32, 34, 36 and 37. The optical means of the inner zone 13 of collector portion 11 can be made aspheric to lessen spherical aberration, and of course need not necessarily consist of three lenses.

There may be some reduction in intensity of illumination at both the inner and outer edges of the collimated beam due to vignetting, but this is in general a minor factor compared to nonuniformity resulting from coma. The sign of the residual coma in the present invention is advantageous from the point of view of collimation.

The only refracting element in the outer zone 13 is the field lens 24. The purpose of the field lens 24 is to reduce vignetting, and since it is substantially at a focal plane its only effect will be on vignetting. Changes in the wave lengths will, of course, change the effective index of refraction of the field lens 24 which will effect the degree of vignetting but nothing else. In other words, the effect of chromatic aberration in the outer zone optical system is entirely negligible.

The inner zone radiation is transferred entirely with refracting optics and consequently it will be somewhat more affected by the wave length of the radiation.

The inner zone 13 optics of the collector portion 11 of solar simulator 10 includes the sapphire lenses 28 and 29 and the quartz lens 30, and will have only a very small spherical aberration.

Due to various inherent factors in a solar simulator system it is not always possible to obtain a complete spectral range, with more difficulty being experienced in the ultraviolet range from .2 to .3 mu. The solar simulator 10 of the present invention also conpensates for any deficiency in this area. The reason for the loss of UV is that reflectors are low in UV reflectivity and even quartz lenses lose transmission of UV. In the present case the ultraviolet addition is made near the diaphragm 25. This is accomplished by the torus shaped UV source 31 which may be any suitable UV source having a voltage applied thereto. The visual UV fill-in source to be utilized with this invention would be mercury and xenon gas which gives off ultraviolet rays and also other energy.

It is of course recognized that the UV rays from the UV fill-in radiation source 31 will not be as well collimated as the light passing through the entire collector system 11. However, since this is a small proportion of the total energy this may be neglected. The energy output of the UV source in certain spectral lines is considered averaged over the appropriate wave length region thereby giving the desired results.

The precise curvature of the reflectors and the design of the individual lenses must of necessity be dictated by the individual requirements of the project at hand. This of course may be accomplished by means known to optical engineers and optical physicists and may be conveniently done by machine means, such as machine computers. It should be noted again that the device of the present invention may be clustered together to increase the area of solar radiation.

Among the advantages of the solar simulator 10 of the present invention are the following: parallel energy rays giving uniform energy and illuminaiton distribution over a large area and having the complete spectral range can be achieved with a relatively non-complex system and device; the systems and devices of the present invention may be clustered to form modulated solar simulators; coma, vignetting, and spherical aberration are kept at a minimum; the inner zone optical lens design is simplified by usage in conjunction with the intermediate and outer zone reflector system of the present invention; and much greater intensity radiation sources can be used giving simulated solar radiation over a much larger area, such as three contiguous regions, and the system and device of the present invention is easy and inexpensive to construct when considering the difficulty and costs involved in solar simulator systems, and it is easily utilized.

It is apparent that the described example is capable of many variations and modifications within the scope of the present invention. All such variations and modifications are to be included within the scope of the present invention.

What is claimed is:

1. In a solar simulator comprising a radiant energy source, combination refractive and reflective means for respectively projecting inner zone rays and collecting outer zone rays from said source and focusing all said rays at a point in a focal plane, and means for collimating said rays emanating from said focal point; the improvement comprising collimating means providing a large, uniformly illuminated area, said collimating means comprising:

(a) a first Cassegrain collimating system comprising a primary and a secondary reflector each having an axial aperture therethrough for intercepting and collimating said outer zone rays to form an annular outer illuminating zone, and passing said inner zone rays, said first system being axially disposed in alignment with and in the path of said emanating rays;

(b) a second Cassegrain collimating system having an outer diameter substantially equal to the greater aperture of said reflectors of said first system and comprising a primary and a secondary reflector each having an axial aperture therethrough for intercepting and collimating an outer portion of said inner zone rays to form an annular intermediate illuminating zone contiguous with said outer illuminating zone, and passing the remaining inner portion of said inner zone rays, said second system being disposed at a greater distance from said focal point than said first system and in axial alignment therewith in the path of said emanating rays, and (c) a refractive collimating system having an outer diameter substantially equal to the greater aperture of said reflectors of said second system for intercepting and collimating said remaining inner portion of said inner zone rays to form an inner illuminating zone, contiguous with said intermediate zone, said refractive system being disposed at a greater distance from said focal point than said second system and in axial alignment therewith in the path of said emanating rays.

2. In a solar simulator comprising means providing a beam of light rays emanating from a point source and means for collimating said emanating light rays, the improvement comprising collimating means comprising:

(a) a first Cassegrain collimating system comprising first and second reflectors each having a centrally located aperture disposed axially in the path of said emanating rays so that, (1) substantially all of said rays pass through the aperture of said first reflector, (2) an outer peripheral portion of said rays are incident upon the convex reflecting surface of said second reflector and are reflected back to incidence upon the concave reflecting surface of said first reflector from whence said rays are reflected forwardly to form an outer annular zone of collimated light, and (3) the remaining inner portion of said rays pass through the aperture of said second reflector;

(b) a second Cassegrain collimating system comprising third and fourth reflectors, said third and fourth reflectors each having a centrally located aperture, the diameters of said third and fourth reflectors being substantially equal to the diameters of the apertures of said first and third reflectors respectively, said third and fourth reflectors being disposed coaxially with and forwardly of said first Cassegrain system and in the path of said light rays passing through said second reflector aperture, so that (1) substantially all of said light rays passing through said second reflector aperture subsequently pass through said third reflector aperture, (2) an outer peripheral portion of said rays are incident upon the convex reflecting surface of said fourth reflector and are reflected back to incidence upon the concave reflecting surface of said third reflector from whence said rays are reflected forwardly to form an intermediate annular zone of collimated light contiguous with said outer zone and, (3) the remaining inner portion of said rays pass through the aperture of said fourth reflector; and (c) a refractive collimating system of a diameter substantially equal to the aperture of said third reflector, said refractive system being disposed coaxially with and forwardly of said second Cassegrain system so that substantially all of said light rays passing through said fourth reflector aperture are incident upon and transmitted by said refractive system, thereby forming an inner annular zone of collimated light contiguous with said intermediate zone.

References Cited

UNITED STATES PATENTS

| | | | |
|---|---|---|---|
| 3,177,397 | 4/1965 | Keeran | 88—57 |
| 3,200,253 | 8/1965 | Geier | 88—57 |
| 3,239,660 | 3/1966 | Hall | 88—57 |

JEWELL H. PEDERSEN, *Primary Examiner.*

R. J. STERN, *Assistant Examiner.*